United States Patent
Bhattacharya et al.

(10) Patent No.: US 9,329,235 B2
(45) Date of Patent: May 3, 2016

(54) LOCALIZING FAULT FLOP IN CIRCUIT BY USING MODIFIED TEST PATTERN

(71) Applicant: Synopsys, Inc., Mountain View, CA (US)

(72) Inventors: Parthajit Bhattacharya, Bangalore (IN); Rohit Kapur, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 56 days.

(21) Appl. No.: 14/207,070

(22) Filed: Mar. 12, 2014

(65) Prior Publication Data

US 2014/0281777 A1    Sep. 18, 2014

(30) Foreign Application Priority Data

Mar. 13, 2013 (IN) .......................... 1068/CHE/2013

(51) Int. Cl.
| | |
|---|---|
| *G01R 31/28* | (2006.01) |
| *G01R 31/3185* | (2006.01) |
| *G01R 31/3183* | (2006.01) |
| *G01R 31/3181* | (2006.01) |
| *G01R 31/319* | (2006.01) |

(52) U.S. Cl.
CPC .. *G01R 31/318569* (2013.01); *G01R 31/31813* (2013.01); *G01R 31/31921* (2013.01); *G01R 31/318371* (2013.01); *G01R 31/318544* (2013.01)

(58) Field of Classification Search
CPC ............... G01R 31/318569; G01R 31/318544; G01R 31/3177
See application file for complete search history.

(56) References Cited

U.S. PATENT DOCUMENTS

| | | | | |
|---|---|---|---|---|
| 5,475,695 | A * | 12/1995 | Caywood et al. | 714/738 |
| 6,185,707 | B1 * | 2/2001 | Smith et al. | 714/724 |
| 6,288,955 | B1 * | 9/2001 | Shibano et al. | 365/201 |
| 6,418,545 | B1 | 7/2002 | Adusumilli | |
| 6,557,129 | B1 * | 4/2003 | Rajski et al. | 714/729 |
| 6,618,830 | B1 * | 9/2003 | Balachandran et al. | 714/737 |
| 7,139,948 | B2 * | 11/2006 | Rearick et al. | 714/726 |
| 7,370,254 | B2 | 5/2008 | Rajski et al. | |
| 7,859,285 | B2 * | 12/2010 | Sheu et al. | 324/750.3 |
| 8,261,142 | B2 * | 9/2012 | Guo et al. | 714/726 |
| 8,694,951 | B1 | 4/2014 | Prasanna et al. | |
| 2005/0055617 | A1 | 3/2005 | Wang et al. | |
| 2007/0061637 | A1 * | 3/2007 | Ward et al. | 714/718 |
| 2007/0143651 | A1 * | 6/2007 | Kiryu | 714/724 |
| 2007/0179731 | A1 * | 8/2007 | Suri et al. | 702/117 |

(Continued)

OTHER PUBLICATIONS

Chakrabarty, K. et al., "Test Planning for Modular Testing of Hierarchical SOCs," IEEE Transactions on Computer-Aided Design of Integrated Circuits and Systems, Mar. 2005, pp. 435-448, vol. 24, No. 3.

(Continued)

*Primary Examiner* — Esaw Abraham
(74) *Attorney, Agent, or Firm* — Fenwick & West LLP

(57) ABSTRACT

A method for localizing at least one scan flop associated with a fault in an integrated circuit. A first test pattern, including a first scan-in data and first control data, is generated. Based on the first control data of the first test pattern, a first fault data is generated by applying the first scan-in data of the first test pattern to scan flops in a test circuit of the integrated circuit. If the first fault data indicates that a fault may be present in the integrated circuit, a second test pattern, including a second scan-in data and a second control data is generated.

17 Claims, 6 Drawing Sheets

(56) References Cited

U.S. PATENT DOCUMENTS

| | | | |
|---|---|---|---|
| 2007/0234169 | A1 | 10/2007 | Rajski et al. |
| 2008/0294955 | A1 | 11/2008 | Kapur et al. |
| 2008/0301510 | A1 | 12/2008 | Kapur et al. |
| 2009/0240458 | A1 | 9/2009 | Desineni et al. |
| 2010/0017760 | A1 | 1/2010 | Kapur et al. |
| 2010/0192030 | A1 | 7/2010 | Kapur et al. |
| 2011/0258498 | A1 | 10/2011 | Chandra et al. |

OTHER PUBLICATIONS

Chandra, A. et al., "Scalable Adaptive Scan (SAS)," EDAA, 2009, 6 pages.

Devanathan, V.R. et al., "Reducing SoC Test Time and Test Power in Hierarchical Scan Test: Scan Architecture and Algorithms," IEEE 20th Int'l Conference on VLSI Design, VLSID'07, 2007, 6 pages.

Dutta et al., "Using Limited Dependence Sequential Expansion for Decompressing Test Vectors," IEEE Int'l Test Conference, 2006, Paper 23.1, pp. 1-9.

Gonciari, P.T. et al., "Compression Considerations in Test Access Mechanism Design," IEE Proc.-Comput. Digit. Tech, Jan. 2005, pp. 89-96, vol. 152, No. 1.

Iyengar, V. et al., "A Unified SOC Test Approach Based on Test Data Compression and TAM Design," Proceedings of the 18th IEEE International Symposium on Defect and Fault Tolerance in VLSI Systems, (DFT'03), IEEE, 2003, 8 pages.

Iyengar, V. et al., "Test Access Mechanism Optimization, Test Scheduling, and Tester Data Volume Reduction for System-on-Chip," IEEE Transactions on Computers, Dec. 2003, pp. 1619-1632, vol. 52, No. 12.

Kapur, R. et al., "Manufacturing Test of SoCs," Proceedings of the 11th Asian Test Symposium, (ATS'02), IEEE, 2002, 3 pages.

Larsson, A. et al., "Test-Architecture Optimization and Test Scheduling for SOCs with Core-Level Expansion of Compressed Test Patterns," EDAA, 2008, pp. 188-193.

Nadeau-Dostie, B. et al., "Improved Core Isolation and Access for Hierarchical Embedded Test," IEEE Design & Test of Computers, Jan./Feb. 2009, pp. 18-25.

Remmers, J. et al.,"Hierarchical DFT Methodology—A Case Study," ITC International Test Conference, IEEE, 2004 Paper 30.2, pp. 847-856.

Sinanoglu, O. et al., "A Non-Intrusive Isolation Approach for Soft Cores," EDAA, 2007, pp. 27-32.

Srinavasan, P. et al., "Hierarchical DFT with Combinational Scan Compression, Partition Chain and RPCT," 2010 IEEE Annual Symposium on VLSI, IEEE, 2010, pp. 52-57.

Su et al., "Multiple Path Sensitization for Hierarchical Circuit Testing," IEEE 1990 Int' l Test Conference, Paper 6.2, pp. 152-161.

Su et al., "Computer-Aided Design of Pseudoexhaustive BIST for Semiregular Circuits," 1990 IEEE International Test Conference, 1990, Paper 30.4, pp. 680-689.

Wohl, P. et al., "Fully X-tolerant Combinational Scan Compression," 2007 IEEE International Test Conference, IEEE, 2007, Paper 6.1, pp. 1-10.

Wohl, P. et al., "Minimizing the Impact of Scan Compression," 25th IEEE VLSI Test Symposium (VTS'07), IEEE, 2007, 8 pages.

Xu, Q. et al., "Modular and Rapid Testing of SOCs With Unwrapped Logic Blocks," IEEE Transactions on Very Large Scale Integration (VLSI) Systems, Nov. 2005, pp. 1275-1285, vol. 13, No. 11.

* cited by examiner

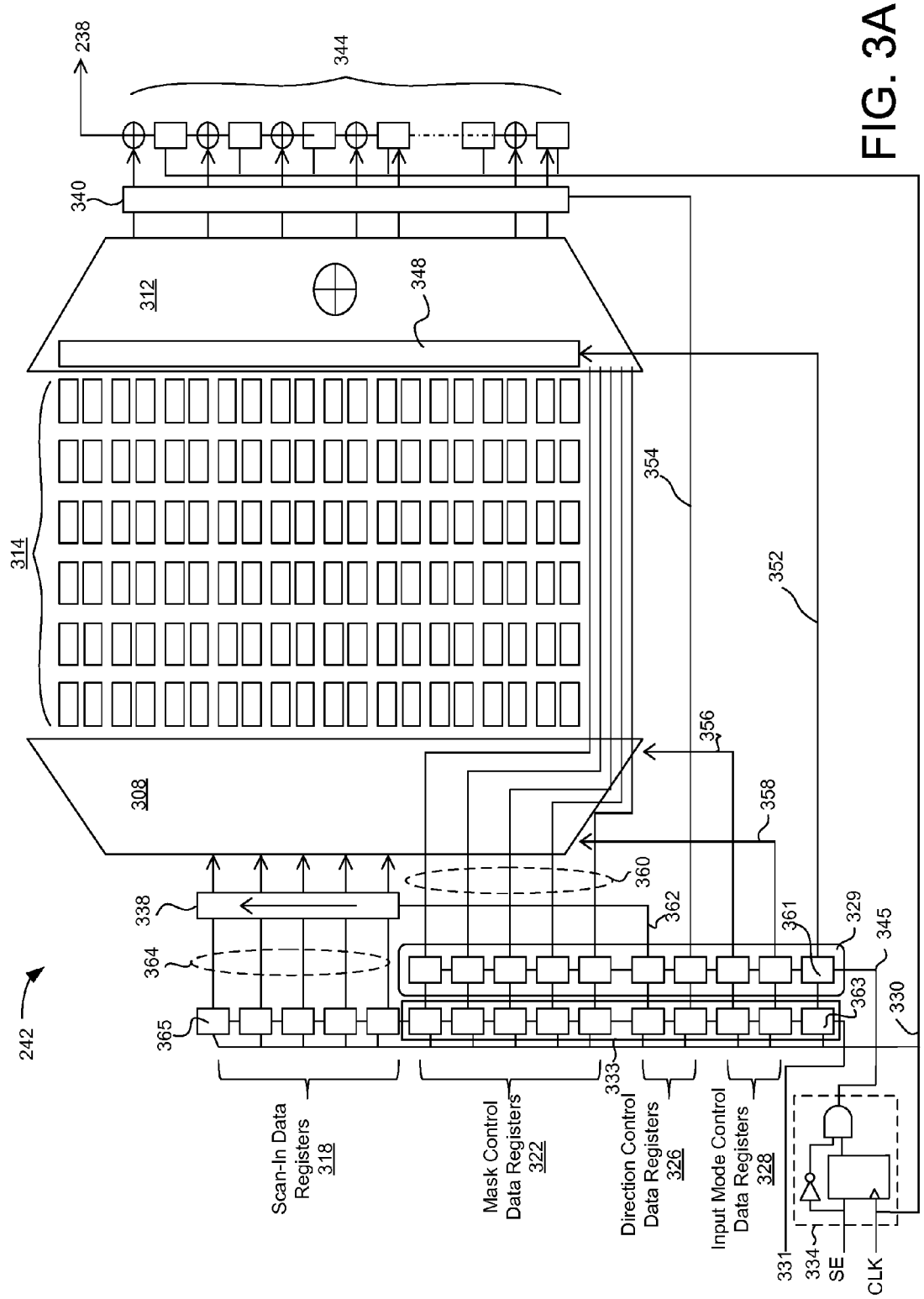

LOCALIZING FAULT FLOP IN CIRCUIT BY USING MODIFIED TEST PATTERN

CROSS REFERENCE TO RELATED APPLICATIONS

This application claims the benefit of Indian Provisional Application No. 1068/CHE/2013, filed Mar. 13, 2013, which is incorporated by reference in its entirety.

BACKGROUND

1. Field of the Disclosure

The present disclosure relates to localizing a scan flop associated with a fault detected during testing of an integrated circuit using automated test equipment (ATE).

2. Description of the Related Art

A defect is an error introduced into an integrated circuit (IC) during a semiconductor manufacturing process. Defects that alter the behavior of the IC can be described by a mathematical fault model. During testing of the IC, a test pattern is applied to the IC and logic value outputs from the IC are observed. When the IC is operating as designed, the logic value output coincides with expected output values specified in test patterns. A fault in the IC is detected when the logic value output is different than the expected output.

Automatic Test Pattern Generation (ATPG) refers to an electronic design automation (EDA) process that generates a set of test patterns for applying to an IC to detect faulty behavior caused by defects in the IC. The generated patterns are used to test semiconductor devices after manufacture, and in some cases to assist with determining the cause of fault. The fault model may be used to generate the test patterns that effectively covers certain types of faults with a fewer number of test patterns.

To receive and detect faults in the IC, the IC includes a test circuit that receives and applies the test patterns to one or more scan chains. A scan chain includes a row of multiple scan flops that output a certain logic value when the test pattern is applied. An unexpected output of a scan flop is indicative of certain faults or defects in circuit components associated with the scan flop.

Outputs of multiple scan flops may be compressed into a bit stream to reduce data bandwidth and pins associated with the testing of IC. Compression of the output of the scan flop into a bit stream decreases the amount of information that may be extracted from the bit stream. For instance, an unexpected value on one of the bits of the bit stream may be associated with multiple scan flops and determination as to which scan flop caused the unexpected value may not be easily made.

SUMMARY

Embodiments relate to localizing scan flops in a scan chain of a test circuit that indicates an error on a circuit component associated with the scan chain. A first test pattern is generated. The first test pattern includes a first scan-in data and a first control data. The first scan-in data is applied to the scan flops of the test circuit and a first fault data is generated based on the first control data. If the first fault data indicates that a fault is present, a second test pattern is generated. The second test pattern includes a second scan-in data and a second control data. The second scan-in data is applied to the scan flops of the test circuit and a second fault data is generated based on the second control data. A scan flop associated with the fault is identified by identifying a scan flop that is common to first scan flops that would generate the first fault data and second scan flops would that generate the second fault data.

BRIEF DESCRIPTION OF THE DRAWINGS

The teachings of the embodiments can be readily understood by considering the following detailed description in conjunction with the accompanying drawings.

FIG. 3A is a circuit diagram of a test circuit in the DUT, according to one embodiment.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Figure 1:
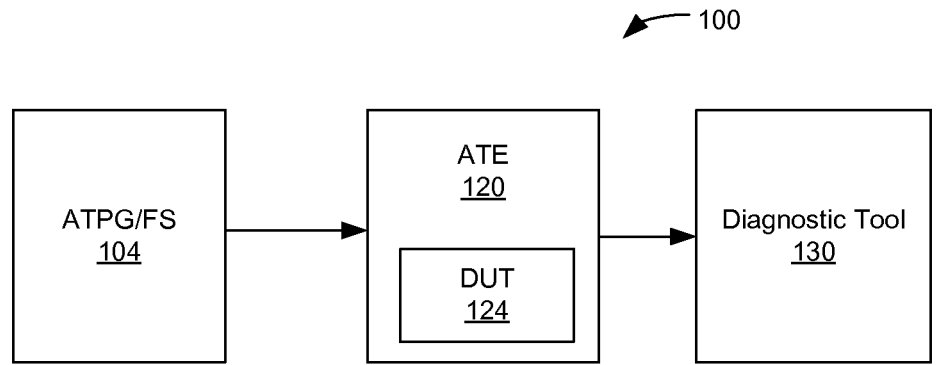
FIG. 1 is a block diagram illustrating a system for testing and diagnosing a device under test (DUT), according to one embodiment.

FIG. 1 is a block diagram illustrating a system 100 for testing and diagnosing a device under test (DUT) 124, according to one embodiment. DUT 124 is an integrated circuit (IC) that is being tested for faults in its fabrication process. The system 100 may include, among other components, an automatic test pattern generator/fault simulator (ATPG/FS) 104, an automatic test equipment (ATE) 120, and a diagnostic tool 130. One or more of these components may be combined into a single product or device.

ATPG/FS 104 generates test patterns provided to ATE 120 and scan-out values corresponding to the test patterns for detecting faults in DUT 124. Scan-out values represent the expected output from a faultless integrated circuit when provided with the test patterns. A test pattern includes scan-in data and control data for controlling test operation in DUT 124, as described below in detail with reference to FIG. 3A. ATE 120 provides the test patterns as scan-in data and control data to DUT 124, and captures output from DUT 124. The captured output from DUT 124 is compared with scan-out values. ATE 120 then generates fault data indicating the difference in the scan-out values and the output from DUT 124.

ATE 120 then sends fault data to diagnostic tool 130 to localize and diagnose the cause of faults in DUT 124. If a fault is detected based on an unexpected output of DUT 124, diagnostic tool 130 may request ATPG/FS 104 to generate further test patterns to localize or specify a scan flop associated with the unexpected value.

Figure 2:
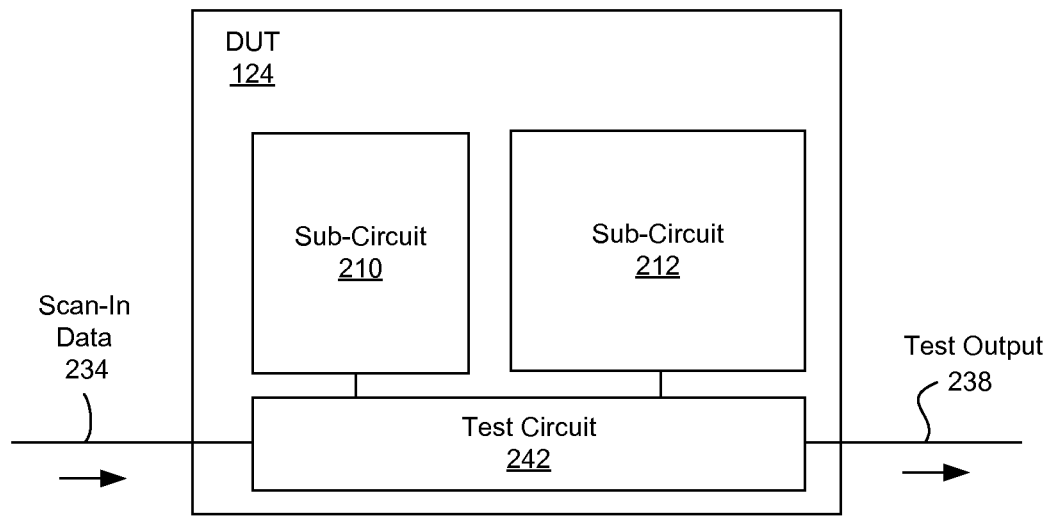
FIG. 2 is a block diagram of a DUT including a test circuit, according to one embodiment.

FIG. 2 is a block diagram of DUT 124 including a test circuit 242 for performing testing of sub-circuits in DUT 124, according to one embodiment. DUT 124 may include, among other components, one or more sub-circuits 210, 212 and test circuit 242. DUT 124 may have a plurality of pins connected to the sub-circuits 210, 212 and test circuit 242. Since the number of pins on an integrated circuit (IC) is limited, pins are often multiplexed to perform more than one function. One of such multiplexed function is receiving scan-in data 234 (i.e., test patterns) from ATPG/FS 104 and sending test output data 238 (i.e., an output in response to the test patterns) to diagnostic tool 130.

Test circuit 242 includes hardware circuitry providing scan-in data 234 to chains of scan flops. Test circuit 242 also generates test output data 238 corresponding to scan-in data 234. It is generally advantageous for test circuit 242 to be connected to fewer pins, perform testing at a high speed, and obtain higher fault coverage with fewer test patterns.

Although test circuit 242 is illustrated in FIG. 2 as testing both sub-circuits 210, 212, more than one test circuit may be provided in DUT to separately test a certain sub-circuit. In embodiments with multiple test circuits, each test circuit may be connected to the same or different pins.

FIG. 3A is a circuit diagram of test circuit 242 in the DUT 124, according to one embodiment. Test circuit 242 may include, among other components, a decompressor 308, a compressor 312, chains of scan flops 314, input registers 318, 322, 326, 328, 329, output register 344, input direction block 338, output direction block 340, and control logic 334. Test circuit 242 provides scan-in data 234 to the scan flops 314 via input direction block 338 and generates test output data 238 by operating circuit components according to control values stored in current control registers 329.

Control logic 334 synchronizes the operation of components in test circuit 242 by providing a clock signal via line 345. When a clock signal is input to current control registers 329, the bit values in control registers 333 are loaded onto current control registers 329. The control circuit receives scan enable (SE) signal and clock signal (CLK). SE signal indicates that the test circuit 242 should be activated to perform testing operation. CLK signal is used for synchronizing the operation of various components in test circuit 242. Control logic 334 includes a flip-flop, an AND gate and an inverter but different combinations or structures may also be used.

Bit values of scan-in data and control data are stored in corresponding registers by sequentially shifting bit values from register 363 at the bottom of the register chain up to a scan-in data registers 365 at the top of the register chain as bits for the current test pattern is received via line 331. Although a single line 331 is illustrated in FIG. 3A as receiving the scan-in data and the control data, more than one line may be used to transmit scan-in data and the control data to corresponding registers. Registers 333 shift values from scan-in data received via line 331 to scan-in data registers 318. At the end of the shifting process to store scan-in data in scan-in data registers 318, SE signal goes low and control logic 334 drives current registers 329 via line 345. Current registers 329 stores control values until the next capture clock so that decompressor 308 and compressor 312 can be controlled without undergoing change with every shift of scan-in data. That is, registers 333 enable control values to be shifted to register 329 only once per pattern.

Scan-in data registers 318 store bit values for scan-in data that is fed to decompressor 308 via line 364 and input direction block 338. The stored scan-in data is sent via lines 364 and input direction block 338 to decompressor 308.

Figure 3B:
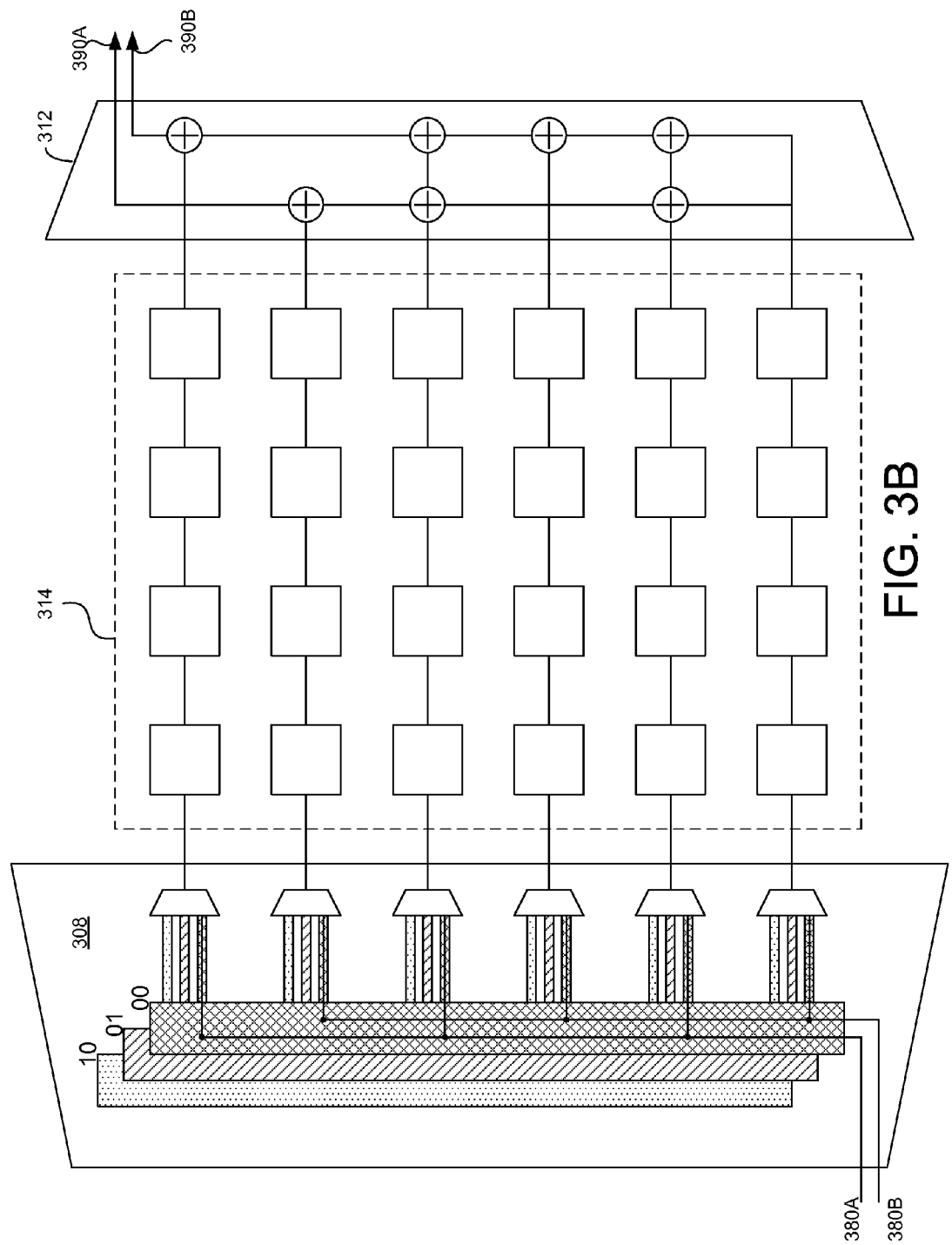
FIG. 3B is a conceptual diagram illustrating the operation of decompressor and compressor in a test circuit, according to one embodiment.

Decompressor 308 may operate in one of multiple modes as set by bit values in input mode control data registers 328 received via lines 356, 358. Each mode of decompressor 308 maps scan-in data to certain scan flops, as described below in detail with reference to FIG. 3B. Bit values in scan-in data registers may be provided to decompressor 308 in a forward direction (i.e., down-up direction) by input direction block 338 (as shown in FIG. 3B) or a reversed direction (i.e., up-down direction) based on the bit value provided by line 362.

Bit values in mask control data registers 322 of the current control registers 329 define the masking of certain scan chains. The bit values of mask control data registers 322 are provided to compressor 312 via lines 360. In response to receiving mask enable signal via line 352 and active signals in lines 360, a mask block 348 in compressor 312 masks certain scan chains as defined by the bit values of mask control data registers 322. The mask enable bit value stored in register 361 is sent to mask block 348 to enable or disable masking operation via line 352. Masking is done for the purpose of, for example, blocking scan chains capturing unknown values (referred to as "X") during unloading process.

A bit value in direction control data registers 326 of the current control registers 329 is sent to output direction block 340 via line 354 to control the direction of outputs from compressor 312. Outputs from scan flops 314 are exclusive OR (XOR) processed by compressor 312 to generate compressed outputs. These compressed outputs pass through the direction control logic 340 to register 344. The compressor outputs are stored in output registers 344. The bit values in output registers 344 are XOR processed into test output data 238. In the embodiment of FIG. 3A, the bit values in test output data 238 is output in a forward direction (i.e., top first and bottom last). However, the bit values in output registers may be output in a reverse direction (i.e., bottom first and top last) if the bit value received via line 354 is reversed.

Some of current control registers 329 store bit values for a current test pattern and other current control registers 329 store bit values for a previous test pattern preceding the current test pattern. Specifically, bit values in input mode control data registers 328 of current control registers 329, and a bit value in direction control data registers 326 of current control registers 329 controlling input direction block 338 for the scan-in data of the current test pattern are for the current test pattern. Conversely, bit value in direction control data registers 326 of current control registers 329 controlling output direction block 340 for the current test pattern, bit values in mask control data registers 322 of current control registers 329, a bit value in mask enable register 361 of current control registers 329 are for the previous test pattern. This mixture of control values at 329 is due to the fact that, while one pattern is being loaded through line 331, the previous pattern is being unloaded through line 238.

FIG. 3B is a conceptual diagram illustrating the operation of decompressor 308 and compressor 312 in a test circuit, according to one embodiment. Decompressor 308 may be selected to operate in one of the selected modes (labeled as "00", "01", and "10" in FIG. 3B) based on signals provided by lines 356, 358. Each mode may provide different mappings to route scan-in data 380A, 380B (only two bits of scan-in data are shown in FIG. 3B for simplification) received from scan-in data registers 318 to scan flops 314. This mapping provides an efficient way to handle dependencies of bit patterns to be applied to scan flops 314.

In compressor 312, the outputs from the rows of scan flops (i.e., scan chains) are XOR processed into fewer number of compressor outputs 390A, 390B. Outputs from each column of scan flops are fed sequentially to the compressor 312. Certain combinations of the outputs from the scan flops are XOR processed to generate compressor outputs 390A, 390B.

By compressing the outputs for the scan flops, the amount of data to be transmitted to ATE 120 and diagnostic tool 130 may be reduced. The disadvantage of compressing the outputs from the scan flops is that, when an unexpected value representing a fault occurs in the outputs 390A, 390B, the scan flop causing the fault may not be localized. Further test patterns or analysis may be needed to determine the exact scan flop associated with the fault.

For example, the compressor of FIG. 3B compresses the output of the test circuit into two output values 390A and 390B. Output 390A of FIG. 3B is the result of the XOR operation between the output of the first scan chain, the third scan chain, the fourth scan chain, the fifth scan chain and the sixth scan chain. Hence, an unexpected value in output 390A may originate from faults associated with any one or more of the first scan chain, the third scan chain, the fourth scan chain, the fifth scan chain and the sixth scan chain. Similarly, output 390B of FIG. 3B is the result of the XOR operation between the output of the second scan chain, the third scan chain, the fifth scan chain and the sixth scan chain. Hence, an unexpected value in output 390B may originate from faults associated with any one or more of the second scan chain, the third scan chain, the fifth scan chain and the sixth scan chain. In order to identify the exact scan chain and/or scan flop causing the unexpected values in the outputs, additional test patterns or analysis may be needed.

Figure 4A:
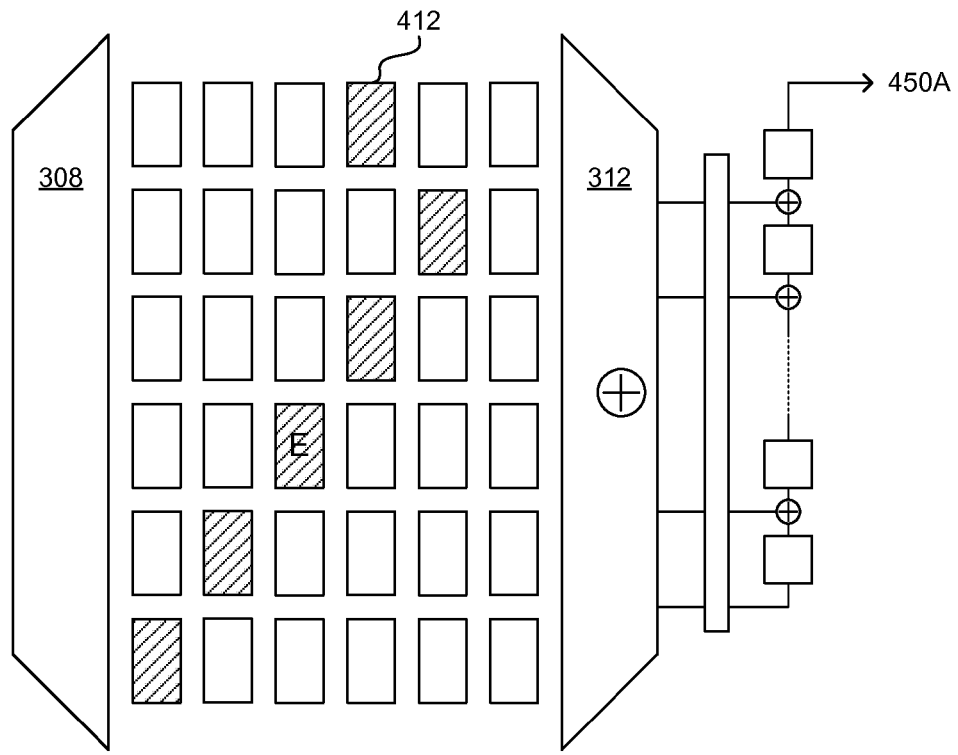
FIG. 4A is a diagram illustrating possible locations of a fault flop generating an unexpected output when a first test pattern is applied, according to one embodiment.

FIG. 4A is a diagram illustrating possible locations of a fault flop generating an unexpected output when a first test pattern is applied, according to one embodiment. As used herein, a fault flop refers to a scan flop generating an unexpected output. The first test pattern includes a first scan-in data and control data for controlling the operation of test circuit 242. Due to compression at the compressor 312, the exact location of the scan flop causing an unexpected output may not be detectable by analyzing the test output data 450A.

Taking the example of FIG. 4A, a scan flop marked with "E" is generating an output representing certain fault. As a result of unexpected output from this scan flop, test output data 450A may be (0, 0, 0, 0, 1, 0, 0, 0) when the expected scan-out value is (0, 0, 0, 0, 0, 0, 0, 0). Although the value of "1" in fifth bit of test output data 450A indicates that there is a scan flop detecting a fault, its location may be ambiguous due to compression since an unexpected output from any of hatched blocks 412 may result in the same test output data (0, 0, 0, 0, 1, 0, 0, 0). For instance, the fifth bit of the test output data 450A may correspond to the XOR operation of all the hatched blocks 412. Therefore, a value of "1" in the fifth bit of the output data 450A may be generated if any of the hatched blocks 412 produce an output of "1" indicating an error.

Embodiments relate to generating a second pattern based on the first test pattern to localize the scan flop associated with the fault. The second pattern may include the same scan-in data as the first test pattern but have different control data compared to the first test pattern. The control data in the second test pattern that is different from the first patter may be one or more of the following: (i) direction control data bit (stored in registers 326) for controlling output direction block 340, and (ii) mask control bits (stored in registers 322).

Figure 4B:
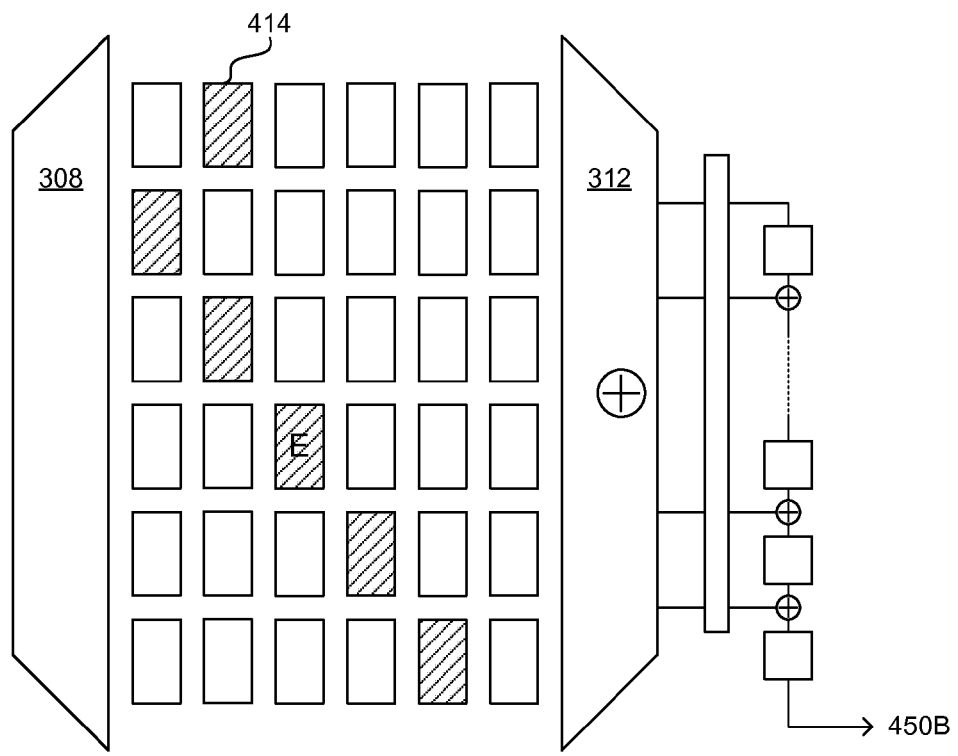
FIG. 4B is a diagram illustrating possible locations of a fault flop generating an unexpected output when a second test pattern is applied, according to one embodiment.

FIG. 4B is a diagram illustrating possible locations of a fault flop generating an unexpected output when a second test pattern is applied, according to one embodiment. In this embodiment, the second test pattern is generated by using the same scan-in data as the first test pattern but has the control data for controlling output direction block 340 reversed. As a result, test output data 450B generated by the second test pattern may be (0, 0, 0, 0, 0, 0, 1, 0, 0) when the scan-out values are (0, 0, 0, 0, 0, 0, 0, 0, 0). The unexpected value is the seventh bit in test output data 450B. Such unexpected output indicates that unexpected output from any of hatched blocks 414 may generate test output data 450B of (0, 0, 0, 0, 0, 0, 1, 0, 0).

In the above example described above with reference to FIGS. 4A and 4B, a fault flop (identified with "E") generating the unexpected output may be identified by determining a scan flop common to a set of fault flops 412 that may result in the unexpected test output data 450A and another set of fault flops 414 that may result in the unexpected test output data 450B.

In other embodiments, more than two test patterns can be used to localize the fault flop. For example, an initial test pattern may be followed by one or more test patterns with modified mask control data to localize the scan flop associated with a fault.

In one embodiment, multiple scan flops generating unexpected outputs can be identified by detecting scan flops that can result in unexpected test output data based on the first test pattern and unexpected test output data based on the second test pattern.

Figure 5:
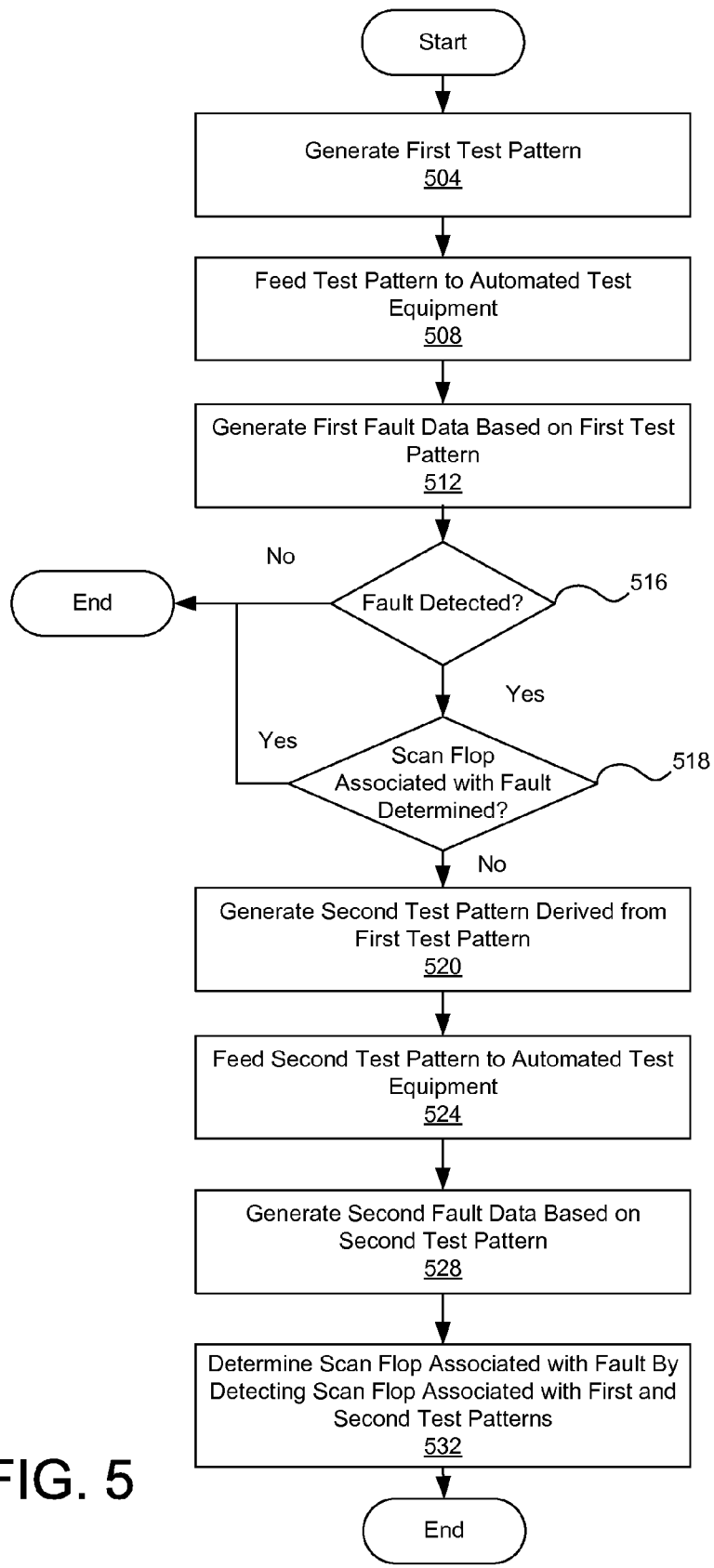
FIG. 5 is a flowchart illustrating a method of localizing a fault flop, according to one embodiment.

FIG. 5 is a flowchart illustrating a method of localizing a fault flop, according to one embodiment. A first test pattern is generated 504 at ATPG/FS 104. The first test pattern is then fed 508 to DUT 124 via ATE 120. As a result, test output is generated by DUT 124, and first fault data is generated 512 by ATE 120 by comparing the scan-out values and the test output. The first fault data is sent to diagnostic tool 130 where fault data is further analyzed. If it is determined 516 that there is no fault in the first fault data, the process terminates.

If fault is detected at diagnostic tool 130, diagnostic tool 130 attempts to determine 518 a scan flop associated with the fault based on the first fault data. If the scan flop associated with the fault can be identified, diagnosis proceeds to find out the exact gate causing the fault, and the process terminates.

If the scan flop associated with the fault cannot be identified based on the first fault data, diagnostic tool 130 sends the relevant data to ATPG/FS 104. Based on the data, ATPG/FS 104 generates 520 a second test pattern derived from the first test pattern. The second test pattern set may include different control data compared to the first test pattern.

The second test pattern set is then fed 524 to DUT 124 via ATE 120. As a result, second fault data is generated 528 at DUT 124. The second fault data is sent to diagnostic tool 130 where fault data is further analyzed. The scan flop associated with the fault can be determined 532 by detecting a scan flop associated with both the first and second test patterns. That is, a scan flop common to a set of fault flops that may result in the unexpected test output data responsive to applying the first test pattern to the DUT 124 and another set of fault flops that may result in the unexpected test output data responsive to applying the second test pattern is identified as the scan flop associated with the fault. Then the process terminates.

In one embodiment, if the scan flop cannot be identified using the first and second scan-out data, further test patterns may be generated to provide additional information on the location of the scan flop associated with the fault.

After the process terminates, further scanning, testing or diagnosing of DUT 124 may be performed using other test patterns.

Figure 6:
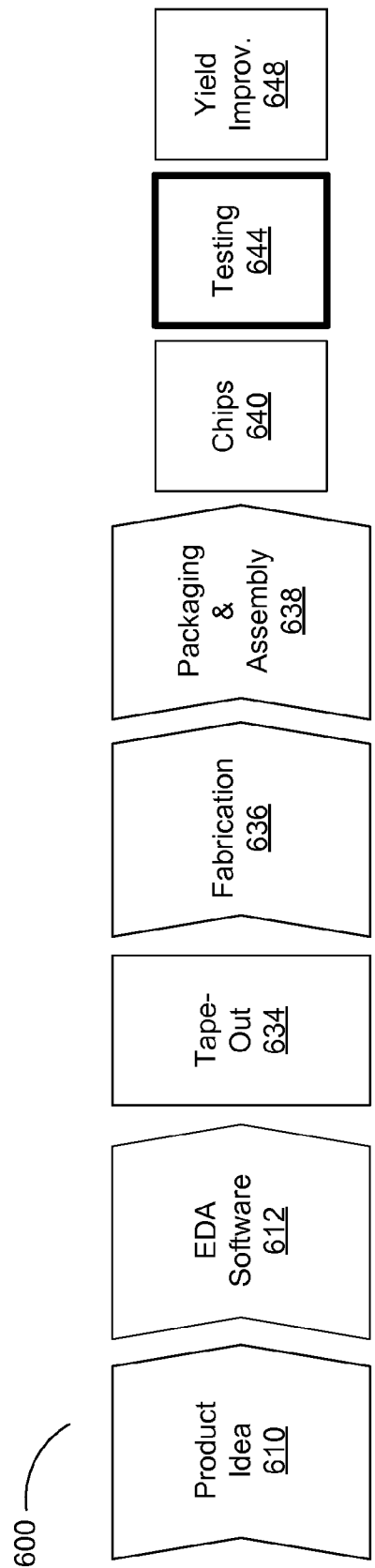
FIG. 6 is a diagram illustrating an overall electronic design automation (EDA) process, according to one embodiment.

FIG. 6 is a flowchart 600 illustrating the various operations in the design and fabrication of an integrated circuit. This process starts with the generation of a product idea 610, which is realized during a design process that uses electronic design automation (EDA) software 612. When the design is finalized, it can be taped-out 634. After tape-out, a semiconductor die is fabricated 636 to form the various objects (e.g., gates, metal layers, vias) in the integrated circuit design. Packaging and assembly processes 638 are performed, which result in finished chips 640. Chips are then tested 644 to detect faults. Based on the detected faults in the tested chips, measures can be taken to improve yield 648 in subsequent batch of chips to be fabricated. Embodiments described above primarily related to testing 644 the chips for faults.

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope of this disclosure.

What is claimed is:

1. A method for localizing at least one scan flop associated with a fault, the method comprising:
   generating a first test pattern comprising first scan-in data and first control data, the first control data of the first test pattern at least identifying a first sequence of compressor outputs used to generate a first fault data, the first sequence of compressor outputs identifying a sequential combination of outputs of a test circuit for generating the first fault data;

receiving first fault data, the received first fault data generated by applying the first scan-in data to scan flops in the test circuit of an integrated circuit based at least on the first control data and compressing an output of the test circuit using the first sequence of compressor outputs;

responsive to determining that the first fault data indicates presence of a fault in the integrated circuit, generating a second test pattern comprising second scan-in data and second control data, the second control data of the second test pattern at least identifying a second sequence of compressor outputs used to generate a second fault data, the second sequence of compressor outputs different than the first sequence of compressor outputs;

receiving second fault data, the received second fault data generated by applying the second scan-in data to the scan flops in the test circuit based at least on the second control data and compressing the output of the test circuit using the second sequence of compressor outputs; and identifying at least one scan flop associated with the fault by identifying at least one scan flop common to first scan flops and second scan flops, an incorrect output of the first scan flops resulting in the first fault data, and an incorrect output of the second scan flops resulting in the second fault data.

2. The method of claim 1, wherein the first scan-in data and the second scan-in data are identical, and wherein generating the second test pattern comprises switching a bit value in the first test pattern for determining a sequence of compressor outputs used to generate the first fault data.

3. A method for localizing at least one scan flop associated with a fault, comprising:

generating a first test pattern comprising first scan-in data and first control data, the first control data of the first test pattern at least identifying a first sequence of compressor outputs used to generate a first fault data, the first sequence of compressor outputs identifying a sequential combination of outputs of a test circuit for generating the first fault data;

generating first fault data by applying the first scan-in data to scan flops in the test circuit of an integrated circuit based at least on the first control data; and generating a second test pattern comprising second scan-in data and second control data responsive to determining that the first fault data indicates presence of a fault in the integrated circuit, the second control data of the second test pattern at least identifying a second sequence of compressor outputs used to generate a second fault data, the second sequence of compressor outputs different than the first sequence of compressor outputs.

4. The method of claim 3, further comprising:

generating second fault data by applying the second scan-in data to the scan flops in the test circuit based at least on the second control data; and identifying at least one scan flop associated with the fault by identifying at least one scan flop common to first scan flops and second scan flops, an incorrect output of the first scan flops resulting in the first fault data, and an incorrect output of the second scan flops resulting in the second fault data.

5. The method of claim 3, wherein the first scan-in data and the second scan-in data are identical.

6. The method of claim 3, wherein generating the second test pattern comprises switching a bit value in the first test pattern for determining a sequence of compressor outputs used to generate the first fault data.

7. The method of claim 6, wherein the first test pattern instructs the integrated circuit to generate fault data in a forward direction, and wherein the second test pattern instructs the integrated circuit to generate fault data in a reverse direction.

8. The method of claim 3, wherein generating the second test pattern comprises switching one or more bit values for masking rows of scan flops.

9. The method of claim 3, wherein generating the first fault data comprises applying scan bit patterns mapped to the first scan-in data by a decompressor.

10. The method of claim 9, wherein generating the first fault data comprises exclusive OR (XOR) processing combinations of scan flop outputs.

11. An apparatus for localizing at least one scan flop associated with a fault in an integrated circuit, comprising:

an automatic test pattern generator configured to generate a first test pattern and a second test pattern derived from the first test pattern, the first test pattern at least identifying a first sequence of compressor outputs used to generate a first fault data, and the second test pattern at least identifying a second sequence of compressor outputs used to generate a second fault data, the second sequence of compressor outputs different than the first sequence of compressor outputs, the first sequence of compressor outputs identifying a sequential combination of outputs of the integrated circuit for generating the first fault data;

an automatic test equipment configured to apply the first test pattern to the integrated circuit and capture first fault data corresponding to the first test pattern, and apply the second test pattern to the integrated circuit and capture second fault data corresponding to the second test pattern; and a diagnostic tool configured to identify at least one scan flop associated with the fault by identifying at least one scan flop common to first scan flops and second scan flops, an incorrect output of the first scan flops resulting in the first fault data, and an incorrect output of the second scan flops resulting in the second fault data.

12. The apparatus of claim 11, wherein the first test pattern comprises a first scan-in data and first control data, and the second test pattern comprises a second scan-in data and second control data.

13. The apparatus of claim 12, wherein the first scan-in data and the second scan-in data are identical.

14. The apparatus of claim 11, wherein the first and second test pattern have a different bit value representing a sequence of compressor outputs for generating fault data.

15. The apparatus of claim 11, wherein the first test pattern instructs the integrated circuit to generate fault data in a forward direction, and wherein the second test pattern instructs the integrated circuit to generate fault data in a reverse direction.

16. The apparatus of claim 11, wherein the first and second test pattern have different bit values representing masking of rows of scan flops.

17. The apparatus of claim 11, wherein the integrated circuit comprises a decompressor, a compressor and scan flops between the decompressor and the compressor, the decompressor mapping scan-in data to a pattern of scan flops and the compressor configured to exclusive OR (XOR) process combinations of scan flop outputs.

* * * * *